United States Patent [19]
Trimberger

[11] Patent Number: 6,011,740
[45] Date of Patent: Jan. 4, 2000

[54] STRUCTURE AND METHOD FOR PROVIDING ADDITIONAL CONFIGURATION MEMORIES ON AN FPGA

[75] Inventor: Stephen M. Trimberger, San Jose, Calif.

[73] Assignee: Xilinx, Inc., San Jose, Calif.

[21] Appl. No.: 09/035,631

[22] Filed: Mar. 4, 1998

[51] Int. Cl.$^7$ .............................................. H03K 19/177
[52] U.S. Cl. ............................. 365/221; 326/38; 326/41
[58] Field of Search ................................. 365/221, 149, 365/154; 326/38, 41, 39

[56] References Cited

U.S. PATENT DOCUMENTS

| | | | |
|---|---|---|---|
| 4,750,155 | 6/1988 | Hsieh | 365/203 |
| 4,821,233 | 4/1989 | Hsieh | 365/203 |
| 5,095,462 | 3/1992 | Norris | 365/221 |
| 5,646,545 | 7/1997 | Trimberger et al. | 326/38 |
| 5,910,732 | 6/1999 | Trimberger | 326/38 |

*Primary Examiner*—Vu A. Le
*Attorney, Agent, or Firm*—Arthur J. Behiel; Jeanette S. Harms

[57] ABSTRACT

Described is a programmable logic device with on-chip configuration memory for controlling the state of various programming points. Each programming point includes two or more sequential memory elements, each of which may be programmed to include a data bit associated with a different circuit configuration. The state of an accessed one of the sequential memory elements (i.e., the bit of configuration data currently stored in that memory element) dictates the current FPGA configuration. Alternate configuration bits are stored in the remaining memory elements. The configuration of the FPGA may then be changed by sequentially shifting a data bit from one of the inactive memory cells into the active memory cell. In one embodiment the sequential memory cells are configured in a ring to support alternating between two or more configurations.

21 Claims, 3 Drawing Sheets

STRUCTURE AND METHOD FOR PROVIDING ADDITIONAL CONFIGURATION MEMORIES ON AN FPGA

FIELD OF THE INVENTION

This invention relates generally to programmable logic devices, and in particular to a system of programmable logic devices that may be reconfigured dynamically.

BACKGROUND

Programmable logic devices (PLDs) are a well-known type of digital integrated circuit that may be programmed by a user (e.g., a circuit designer) to perform specified logic functions. PLDs are becoming ever more popular, largely because they are less expensive and require less time to implement than semi-custom and custom integrated circuits.

One type of PLD, the field programmable gate array (FPGA), typically includes an array of configurable logic blocks, or CLBs, that are programmably interconnected to each other and to programmable input/output blocks (IOBs). This collection of configurable elements may be customized by loading configuration data into internal configuration memory cells that, by determining the state of various programming points, define how the CLBs, interconnections, and IOBs are configured. The configuration data may be read from memory (e.g., an external PROM) or written into the FPGA from an external device. The collective states of the individual memory cells then determine the function of the FPGA.

One prior art FPGA, for example one device of the Xilinx XC4000™ family of FPGAs commercially available from Xilinx, Inc., includes one configuration memory cell to control each programming point. As shown in FIG. 1, a conventional memory cell 101, in one embodiment a latch 103, and an access transistor 105 compromise a five-transistor memory cell that forms the basic control unit for all logic functions on the FPGA. In the embodiment of FIG. 1, signals on a word line WORD and a bit line BIT conventionally control the program state of memory cell 101, which in turn controls the state of a conventional pass transistor 107. U.S. Pat. No. 4,821,233, which issued on Apr. 11, 1989, and U.S. Pat. No. 4,750,155, which issued on Jun. 7, 1988 (both patents incorporated herein by reference), discuss some appropriate configurations for the memory cell of FIG. 1.

FPGAs can be reconfigured any number of times by simply reprogramming the configuration memory cells. Some FPGA applications take advantage of this feature by providing an external memory that includes a number N sets of configuration memory, each of which may be programmed to store a different set of configuration data. The FPGA may then be quickly and easily reprogrammed to function in one of N configurations. Moreover, complex logic functions can be implemented by dynamically reconfiguring the FPGA to sequentially perform more than one logic function on a given set of input signals. Unfortunately, each reconfiguration may require a number of steps that are collectively time consuming, especially in applications that require frequent reconfiguration.

A partial solution to this speed problem involves integrating the reconfiguration memory and associated read/write control circuitry with the FPGA onto a single chip, or die. In one such FPGA, as depicted in FIG. 2, each memory cell 101 of FIG. 1 is replaced with a random access memory (RAM) bit set 200. Bit set 200 includes eight memory cells MC0–MC7. Each memory cell MC is connected via an associated access transistor and a common bit line 203 to a clocked latch 204. Each of memory cells MC0–MC7 can contain different configuration data. That data can then be selectively transferred into latch 204 to control conventional programming points, such as multiplexer control lines, look-up table bits, or, as in the example, a pass transistor 107. For a more detailed description of the circuit of FIG. 2, see U.S. Pat. No. 5,646,545, entitled "Time Multiplexed Programmable Logic Device," issued Jul. 8, 1997, which is incorporated herein by reference.

Integrating the configuration memory and read/write control circuitry with the FPGA solves many problems associated with dynamic reconfiguration; there is still substantial room for improvement, however. For example, the reconfiguration memory, read/write control circuitry, and additional word lines occupy a large percentage of available chip area. Increasing chip area is expensive and slows the logic function of the FPGA.

SUMMARY OF THE INVENTION

The present invention satisfies the need for FPGAs with on-chip configuration memory while reducing the requisite circuit complexity and chip area. To accomplish this, each programming point in an FPGA is supported by two or more sequential memory elements, each of which may be programmed to include a data bit associated with a different circuit configuration. The program state of an accessed one of the sequential memory elements (i.e., the active memory cell) dictates the current FPGA configuration. Alternate configuration bits are stored in the remaining memory elements. The configuration of the FPGA may then be changed by sequentially shifting a data bit from one of the inactive memory cells into the active memory cell.

One FPGA configured in accordance with the present invention includes three configuration memory cells configured as a ring. The ring includes an active memory cell, an alternate configuration memory cell that stores an alternate configuration bit, and a hold register. That embodiment supports FPGA applications that require swapping between configurations. For example, an FPGA may be employed to alternately operate as either a read-control circuit or a write-control circuit for a conventional tape drive.

A configuration swap is accomplished by first shifting the data bit from the active memory cell into the hold register, thus preserving the data. The data bit in the alternate configuration memory cell is then shifted into the active memory cell. Shifting data from the hold register into the alternate configuration memory cell completes the swap.

DETAILED DESCRIPTION OF THE DRAWINGS

Figure 3:
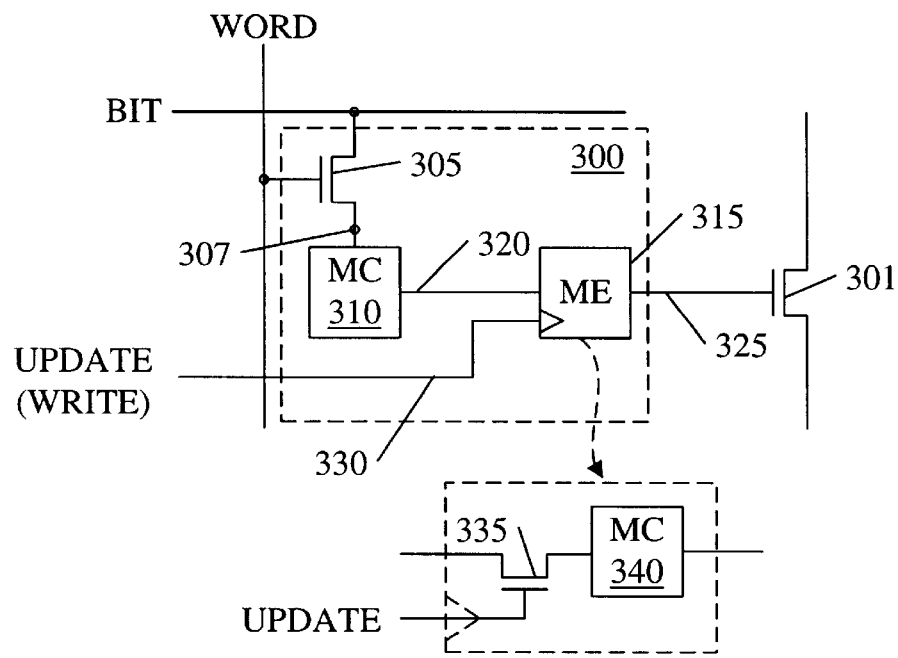
FIG. 3 is a schematic diagram of a logic control circuit 300 in accordance with one embodiment of the present invention.

FIG. 3 is a schematic diagram of a logic control circuit 300 in accordance with one embodiment of the present invention. Logic control circuit 300 is shown connected to a pass transistor 301 like pass transistor 107 of FIG. 1; however, logic control circuit 300 may also control other well-known types of programming points.

Logic control circuit 300 conventionally includes an access transistor 305 having a control terminal connected to a word line WORD, a current-handling terminal connected to a bit line BIT, and a second current-handling terminal connected to a data input terminal 307 of a memory cell (MC) 310. Memory cell 310 is, in one embodiment, a conventional latch; other types of cells may also be used, as will be apparent to those of skill in the art.

Figure 1:
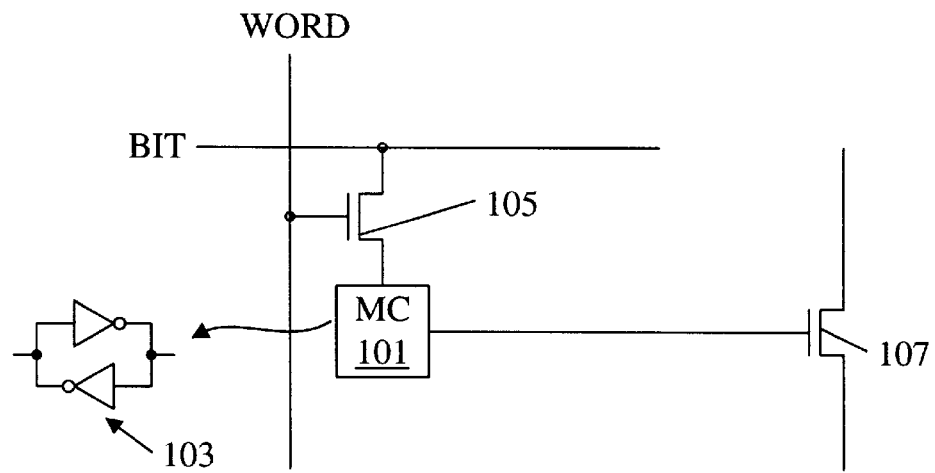
FIG. 1 depicts a conventional memory cell 101 that forms the basic unit of control for all logic functions on an FPGA.

In accordance with the present invention, a memory element (ME) 315 and associated circuitry are added to the conventional circuit of FIG. 1. Memory element 315 has an input terminal connected via a line 320 to an output terminal of memory cell 310 and an output terminal connected via a line 325 to the gate of pass transistor 301. Memory element 315 also includes a write terminal connected via a line 330 to an write terminal UPDATE. When the signal on terminal UPDATE is a logic one (e.g., 3.3 volts), the value stored in memory cell 310 updates the logic level stored in memory element 315. As depicted in FIG. 3, in one embodiment memory element 315 includes a transistor 335 and a memory cell 340, each of which is respectively similar to transistor 305 and memory cell 310. Extending this similarity to physical, electrical, and sequential aspects of memory element 315 greatly simplifies the process of modifying the layout of earlier devices (e.g., FPGAs employing the circuit of FIG. 1) to include circuits in accordance with the invention. In addition, the architectural similarity between the circuit of FIG. 1 and memory control circuit 300 allows conventional configuration control circuitry to be easily adapted for use with memory control circuit 300.

Figure 2:
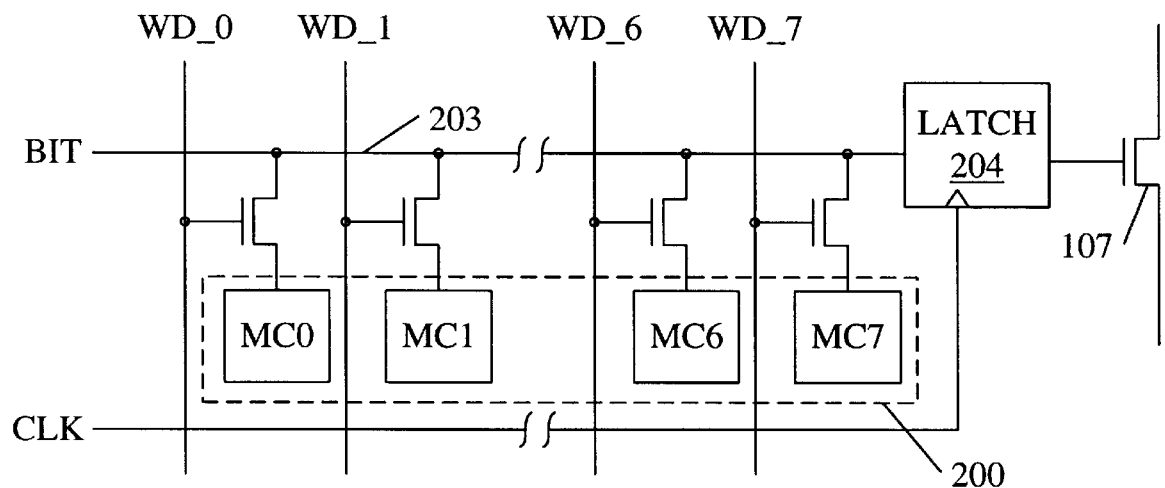
FIG. 2 depicts a known FPGA that includes multiple, integrated configuration memories.

Logic control circuit 300 loads configuration data sequentially into memory cell 310 and memory element 315. As compared with the circuit of FIG. 2, this sequential architecture advantageously reduces the number of required word lines; consequently, logic control circuits in accordance with the present invention occupy substantially less chip area than do conventional multi-configuration logic control circuits. Also advantageous, the configuration data stored in inactive memory cells (e.g., memory cell 310) can be modified without affecting the operation the FPGA. The design can be extended to include three or more memory cells for applications that require storage of more configuration data.

Some applications require swapping back and forth (alternating) between two configurations. For example, an FPGA may be employed to operate as both a read-control circuit and a write-control circuit for a conventional tape drive. For such applications it is desirable to quickly switch between configurations. Circuit 300 is not ideal for such applications because, while circuit 300 can sequentially change from one FPGA configuration to another, circuit 300 cannot quickly switch back. Instead, the previous configuration must be reloaded into memory cell 310 from, for example, some external memory. As discussed in the background section above, this process can be complex and time consuming.

Figure 4:
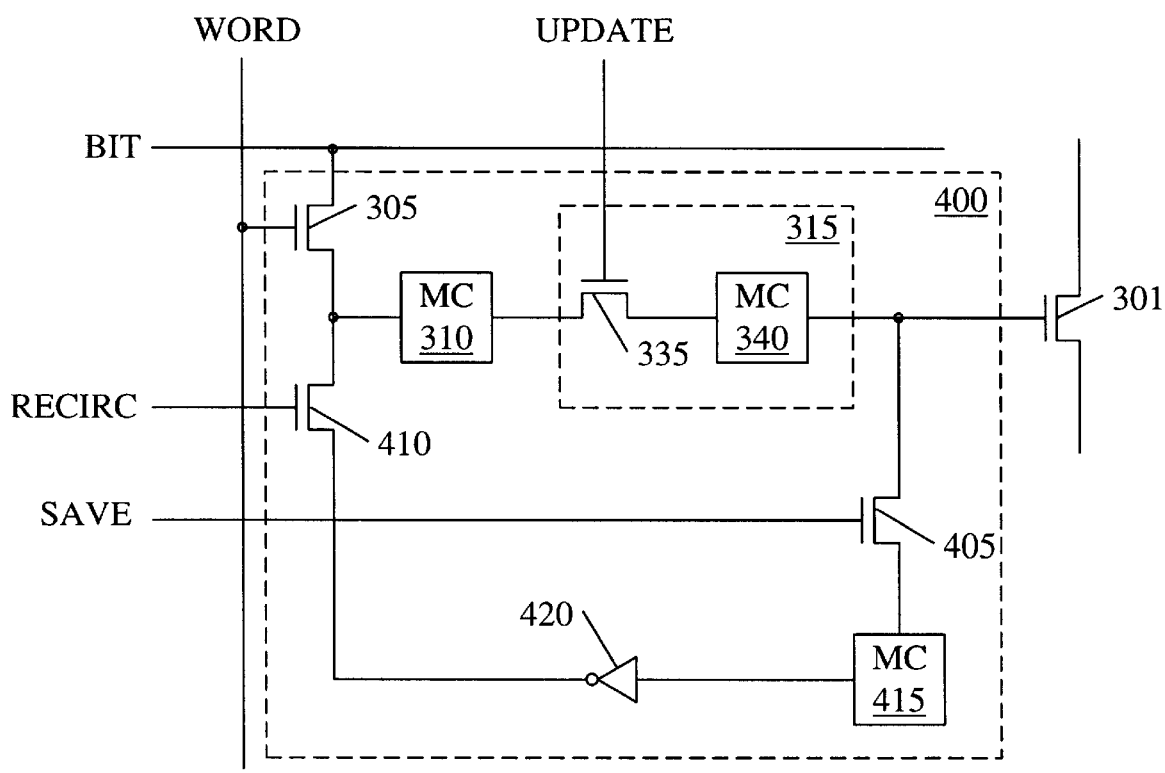
FIG. 4 schematically depicts a logic control circuit 400.

FIG. 4 schematically depicts a logic control circuit 400 that addresses the need for a programmable logic device in which the configuration data may be quickly swapped back and forth between two configurations. In addition to the elements of circuit 300, circuit 400 includes two transistors 405 and 410, an additional memory cell 415, and an inverter 420. As described below, these additional components allow swapping of data between memory cells 310 and 340.

TABLE 1

| Operation | WORD | UPDATE | RECIRC | SAVE |
|---|---|---|---|---|
| Initialize FPGA | 1 | 1 | 0 | 1 |
| FPGA Active | X | 0 | 0 | 1 |
| Hold Active State | 0 | 0 | 0 | 0 |
| Load New Config | 1 | 0 | 0 | X |
| Update Active State | 0 | 1 | 0 | 0 |
| Recirc. Saved State | 0 | 0 | 1 | 0 |

Figure 5:
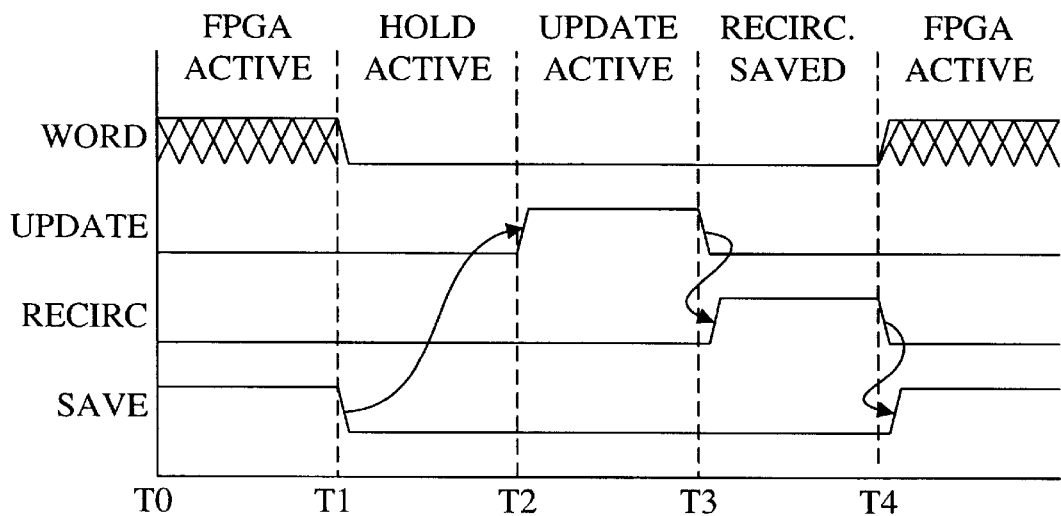
FIG. 5 is a timing diagram illustrating how the contents of a pair of configuration memories in an FPGA may be swapped in accordance with the present invention.

Table 1 details the operational states of logic control circuit 400. Providing the logic necessary to carry out the operations illustrated in FIG. 5 is well within the ability of those of skill in the art.

The FPGA is initialized during the operation entitled "Initialize FPGA." That is, memory cell 340 is programmed with the initial configuration data for controlling pass transistor 301. To accomplish this, the appropriate data (a logic one or zero) is conventionally made available on the bit line BIT. That data is then transferred to memory cell 340 via memory cell 310 and transistors 305 and 335. Logic ones on lines WORD and UPDATE are therefore provided to turn on respective transistors 305 and 335. Finally, a logic one on line SAVE transfers copies the state of memory cell 340 into memory cell 415 for use during a subsequent swap operation.

Once initialized, the FPGA can be placed in an "active" state in which it operates as a logic device; this operation is referred to in Table 1 as "FPGA Active." Transistors 335 and 410 are turned off, effectively isolating memory cells 340 and 415. The state of pass transistor 301 is therefore determined by the data stored in memory cell 340. Transistor 405 is turned on, thereby providing the state of memory cell 340 to memory cell 415 and facilitating subsequent states, such as the "Update Active State" and "Recirculate Saved State".

The operation entitled "Hold Active State" turns off each of transistors 305, 335, 405, and 410 to "hold" the states of memory cells 310, 315, and 415. Note that in this state memory cell 340 still controls pass transistor 301.

The state of memory cell 310 may be altered while the FPGA is active without altering the contents of memory cell 340, and therefore without affecting the operation of the FPGA. To accomplish this, the word line WORD is set to a logic one to allow memory cell 310 to acquire new data presented on bit line BIT. This state is shown as "Load New Config" in Table 1. The operation "Update Active State" transfers the data of memory cell 310 to memory cell 340 via transistor 335.

The last operation, "Recirculate Saved State," transfers the saved state from memory cell 415 back to memory cell 310 via transistor 410. The embodiment of FIG. 4 includes inverter 420 because each memory cell inverts its respective input signal: inverter 420 causes the data in memory cell 340 to be inverted twice (once by memory cell 415). Similar embodiments with an even number of memory cells, for example a four-cell system capable of storing three sets of configuration data, would not require inverter 420.

FIG. 5 is a timing diagram of a swapping operation performed by the circuit of FIG. 4. From time T0 to time T1 the FPGA is active (e.g., performing some logic operation defined by the configuration memory comprised of memory cell 340). Furthermore, the logic level of line SAVE is high so that the state of memory cell 340 is duplicated (although inverted in the depicted embodiment) in memory cell 415. Time T1 demarks the onset of the "swap," at which time each of transistors 305, 335, 405, and 410 are turned off in the "Hold Active State" operation defined in Table 1. At time T2 memory cell 340 is updated by the "Update Active State" operation of Table 1. The contents of memory cell 340 is not lost because duplicate information is available at the output of inverter 420.

Once memory cell 340 is updated, the swap is completed by moving the contents of memory cell 415 into memory cell 310. As depicted in FIG. 5, this is accomplished by turning on transistor 410 to "recirculate" that data from memory cell 340 (via memory cell 415). Table 1 describes this step as "Recirculate Saved State." This operation completes the swap so that the FPGA is free to return active, at time T4, to perform the operation defined by the data just received from memory cell 310. The process of FIG. 5 can then be repeated to return the FPGA to the original state.

Figure 6:
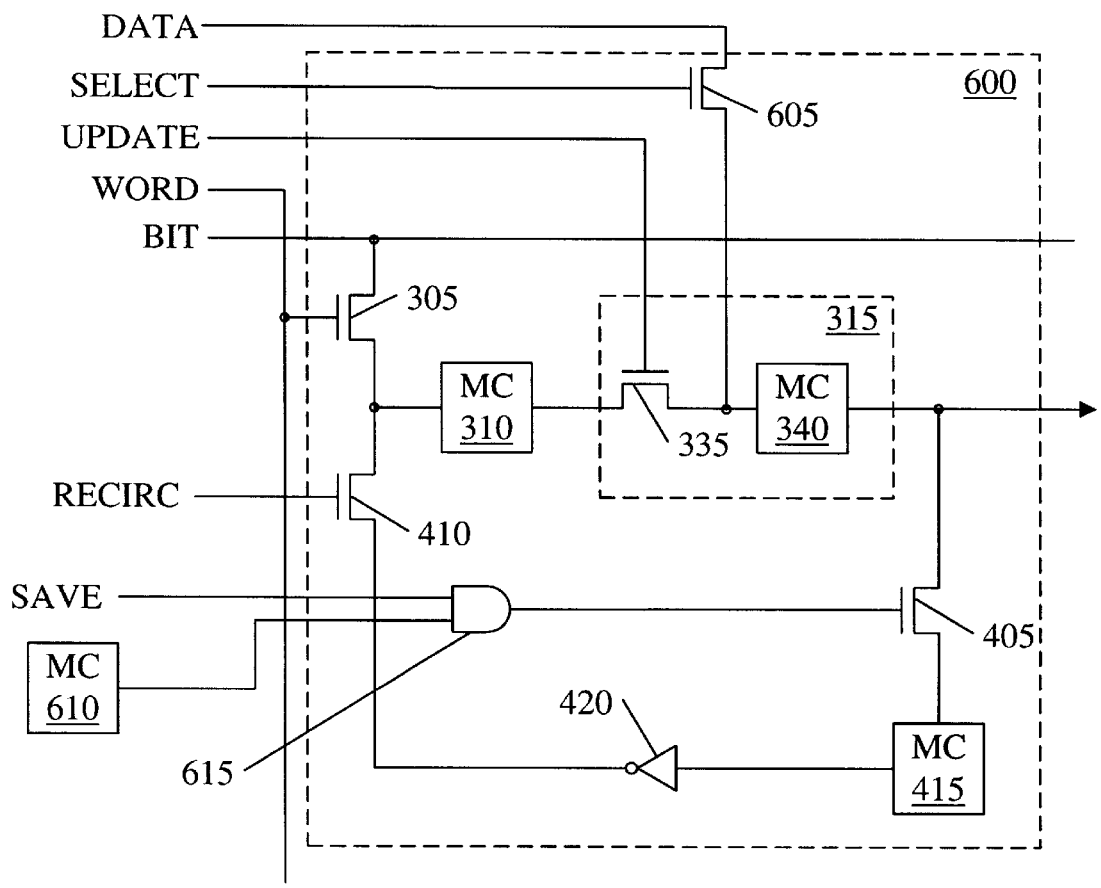
FIG. 6 schematically depicts another embodiment of a logic control circuit 600.

FIG. 6 schematically depicts a logic control circuit 600 in accordance with another embodiment of the invention. Logic control circuit 600 is similar to logic control circuit 400, like numbered elements being the same. Logic control circuit 600 also includes an additional access transistor 605 for writing from a data terminal DATA directly into memory cell 340. This configuration may be used, for example, in FPGAs in which logic control circuits may be configured as random access memory (RAM) cells to offer a user additional flexibility. One such FPGA, in which an array of memory cells may be configured as RAM, is described on pages 4–11 to 4–20 of the 1996 Data Book from Xilinx, Inc. Those pages are incorporated herein by reference.

Logic control circuit 600 also includes an AND gate 615 connected between the save line SAVE and the gate of transistor 405. AND gate 615 also includes an input terminal connected to the output terminal of a memory element 610. Memory element may be a logic control circuit in accordance with the present invention or a conventional memory cell. Other embodiments employ signal sources other than memory elements in place of memory cell 610. For example, signals on line SAVE may be gated instead by user-defined logic or by signals generated by circuits external to the FPGA.

As discussed above in connection with FIG. 5, one logic control circuit in accordance with the invention automatically turns on transistor 405 to save the state of transistor 340 should the data in transistor 340 change. In some applications it may be desirable to retain the data in memory cell 415, of a particular logic control circuit, for later use. Arrays of logic control circuit configured as memory cell 610 allow a user to select which logic control circuits in the array will alter the contents of memory cell 340 without affecting the data stored in memory cell 415. Memory cell 610 is simply programmed to block the global save signal on line SAVE from those logic control circuits in which memory cell 415 is not to be updated.

While the present invention has been described in connection with specific embodiments, variations of these embodiments will be obvious to those of ordinary skill in the art. For example, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

I claim:

1. A programmable logic device comprising:
   a data terminal;
   a first memory element having an input terminal connected to the data terminal and an output terminal;
   a second memory element having an input terminal and an output terminal, wherein the input terminal of the second memory element is connected to the output terminal of the first memory element; and
   a programming point connected to the output terminal of the second memory cell.

2. The programmable logic device of claim 1, further comprising:
   an access transistor having a control terminal connected to a word line;
   a first current-handling terminal connected to a bit line; and
   a second current-handling terminal connected to the data terminal.

3. The programmable logic device of claim 1, wherein the programming point comprises a pass transistor.

4. The programmable logic device of claim 1, the second memory element further comprising a write terminal.

5. The programmable logic device of claim 4, wherein the second memory element further comprises:
   a memory cell having an input terminal and an output terminal, wherein the output terminal of the memory cell is connected to the control terminal of the programming point; and
   a write transistor having a control terminal connected to the write terminal, a first current-handling terminal connected to the output terminal of the first memory element, and a second current-handling terminal connected to the input terminal of the memory cell.

6. The programmable logic device of claim 1, wherein the output terminal of the second memory element is connected to the input terminal of the first memory element.

7. The programmable logic device of claim 6, wherein the output terminal of the second memory element is connected to the input terminal of the first memory element via a third memory element.

8. The programmable logic device of claim 7, wherein the third memory element includes an input terminal connected to the output terminal of the second memory element and an output terminal connected to the input terminal of the first memory element.

9. The programmable logic device of claim 8, further comprising a second transistor having a first current-handling terminal connected between the output terminal of the second memory element and the input terminal of the third memory element.

10. The programmable logic device of claim 9, further comprising a logic gate having an output terminal connected to the control terminal of the second transistor.

11. The programmable logic device of claim 9, further comprising a fourth memory element having an output terminal connected to the control terminal of the second transistor.

12. The programmable logic device of claim 8, further comprising a second transistor having a first current-handling terminal connected between the output terminal of the third memory element and the input terminal of the first memory element.

13. The programmable logic device of claim 1, further comprising a word line connected to only one of the first and second memory elements.

14. The programmable logic device of claim 1, further comprising:

a second data terminal; and an access transistor having a first current-handling terminal connected to the second data terminal and a second current-handling terminal connected to the input terminal of the second memory element.

15. A method of alternating between first and second logic configurations of a programmable logic device, the method comprising:

storing a first data bit representing the first logic configuration in a first memory cell in the programmable logic device;

storing a second data bit representing the second logic configuration in a second memory cell in the programmable logic device;

shifting one of the first and second data bits into a hold register;

shifting the other one of the first and second data bits into one of the first and second memory cells; and shifting the one data bit in the hold register into to other one of the first and second memory cells.

16. The method of claim 15, wherein the first memory cell is a configuration memory cell.

17. The method of claim 16, wherein the second memory cell is an alternate configuration memory cell.

18. The method of claim 15, wherein the first memory cell, the second memory cell, and the hold register are configured as a sequential chain of memory cells.

19. The method of claim 15, wherein the first and second memory cells are two of three or more memory cells in a chain of memory cells.

20. A programmable logic device comprising:

a first memory element having an input terminal and an output terminal;

a second memory element having an input terminal connected to the output terminal of the first memory cell and output terminal connected to a programming point;

means for storing a data bit representing a logic configuration in the first memory cell; and means for shifting the data bit from the first memory cell to the second memory cell.

21. The programmable logic device of claim 20, further comprising means for shifting the data bit from the second memory cell to the first memory cell.

* * * * *